(12) United States Patent
Hung et al.

(10) Patent No.: US 9,142,473 B2
(45) Date of Patent: Sep. 22, 2015

(54) STACKED TYPE POWER DEVICE MODULE

(71) Applicant: Industrial Technology Research Institute, Hsinchu (TW)

(72) Inventors: Yin-Po Hung, Hsinchu County (TW); Tao-Chih Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/849,553

(22) Filed: Mar. 25, 2013

(65) Prior Publication Data

US 2014/0159212 A1  Jun. 12, 2014

(30) Foreign Application Priority Data

Dec. 10, 2012  (TW) .............................. 101146419 A

(51) Int. Cl.
*H01L 23/31* (2006.01)
*H01L 23/538* (2006.01)
(Continued)

(52) U.S. Cl.
CPC ........ *H01L 23/3135* (2013.01); *H01L 23/5389* (2013.01); *H01L 24/24* (2013.01); *H01L 24/82* (2013.01); *H01L 21/568* (2013.01); *H01L 23/295* (2013.01); *H01L 23/3677* (2013.01); *H01L 23/49548* (2013.01); *H01L 23/49568* (2013.01); *H01L 23/49575* (2013.01); *H01L 23/49827* (2013.01); *H01L 24/06* (2013.01); *H01L 24/13* (2013.01); *H01L 24/27* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/0401* (2013.01); *H01L 2224/04042* (2013.01); *H01L 2224/04105* (2013.01); *H01L 2224/0603* (2013.01); *H01L 2224/13023* (2013.01); *H01L 2224/13147* (2013.01); *H01L 2224/24226* (2013.01); *H01L 2224/24246* (2013.01); *H01L 2224/2732* (2013.01); *H01L 2224/27436* (2013.01); *H01L 2224/2919* (2013.01); *H01L 2224/29294* (2013.01); *H01L 2224/29339* (2013.01);
(Continued)

(58) Field of Classification Search
None
See application file for complete search history.

(56) References Cited

U.S. PATENT DOCUMENTS 6,255,672 B1  7/2001  Yoshioka et al.
6,642,576 B1  11/2003  Shirasawa et al.
(Continued)

FOREIGN PATENT DOCUMENTS

TW  200903667  1/2009
TW  201130063  9/2011
(Continued)

OTHER PUBLICATIONS

Motto et al., "Large Package Transfer Molded DIP-IPM", Industry Applications Society Annual Meeting, Oct. 2008, p. 1-p. 5.
(Continued)

*Primary Examiner* — Whitney T Moore
*Assistant Examiner* — Scott R Wilson
(74) *Attorney, Agent, or Firm* — Jianq Chyun IP Office

(57) ABSTRACT

The disclosure relates to a stacked type power device module. May use the vertical conductive layer for coupling the stacked devices, the electrical transmission path may be shortened. Hence, current crowding or contact damages by employing the conductive vias or wire bonding may be alleviated.

11 Claims, 10 Drawing Sheets

(51) Int. Cl.

| | |
|---|---|
| H01L 23/29 | (2006.01) |
| H01L 23/495 | (2006.01) |
| H01L 21/56 | (2006.01) |
| H01L 23/00 | (2006.01) |
| H01L 23/367 | (2006.01) |
| H01L 23/498 | (2006.01) |

(52) U.S. Cl.
CPC ........... H01L 2224/32145 (2013.01); H01L 2224/32225 (2013.01); H01L 2224/32245 (2013.01); H01L 2224/45144 (2013.01); H01L 2224/48247 (2013.01); H01L 2224/73207 (2013.01); H01L 2224/73265 (2013.01); H01L 2224/82039 (2013.01); H01L 2224/82047 (2013.01); H01L 2224/8381 (2013.01); H01L 2224/83424 (2013.01); H01L 2224/83447 (2013.01); H01L 2224/83801 (2013.01); H01L 2224/83851 (2013.01); H01L 2224/92163 (2013.01); H01L 2224/92247 (2013.01); H01L 2225/06562 (2013.01); H01L 2924/1203 (2013.01); H01L 2924/12041 (2013.01); H01L 2924/1305 (2013.01); H01L 2924/1306 (2013.01); H01L 2924/13055 (2013.01); H01L 2924/13091 (2013.01); H01L 2924/15151 (2013.01); H01L 2924/15787 (2013.01); H01L 2924/18165 (2013.01)

(56) References Cited

U.S. PATENT DOCUMENTS

| | | | |
|---|---|---|---|
| 7,385,283 | B2 | 6/2008 | Wu et al. |
| 7,800,217 | B2 | 9/2010 | Otremba et al. |
| 2006/0049995 | A1* | 3/2006 | Imaoka et al. ............ 343/702 |
| 2007/0181908 | A1 | 8/2007 | Otremba |
| 2007/0284720 | A1* | 12/2007 | Otremba et al. ............ 257/690 |
| 2008/0006923 | A1 | 1/2008 | Otremba |
| 2010/0237507 | A1 | 9/2010 | Yamada et al. |
| 2012/0098117 | A1 | 4/2012 | Sato et al. |
| 2012/0267776 | A1 | 10/2012 | Nin |

FOREIGN PATENT DOCUMENTS

| | | |
|---|---|---|
| TW | 201216382 | 4/2012 |
| TW | 201225248 | 6/2012 |

OTHER PUBLICATIONS

Chamund et al., "High Power Density IGBT Module for High Reliability Applications", Power Electronics and Motion Control Conference, May 2009, p. 274-p. 280.

Stevanovic et al., "Low inductance power module with blade connector", Applied Power Electronics Conference and Exposition, Feb. 2010, p. 1603-p. 1609.

Majumdar, "Power Module Technology for Home Power Electronics", Power Electronics Conference, Jun. 2010, p. 773-p. 777.

Vogler et al., "Integration of 1200V SOI gate driver ICs into a medium power IGBT module package", Power Semiconductor Devices & IC's, Jun. 2010, p. 97-p. 100.

Newcombe et al., "Reliability metrics for IGBT power modules", 11th International Conference on Electronic Packaging Technology & High Density Packaging, Aug. 2010, p. 670-p. 674.

Özkiliç et al., "A novel Intelligent Power Module (IPM) in a compact transfer Mold package with New High Voltage Integrated Circuit (HVIC) and integrated bootstrap diodes", 14th International Power Electronics and Motion Control Conference, Sep. 2010, p. T6-14-p. T6-18.

Urciuoli et al., "Performance of a Dual, 1200 V, 400 A, Silicon-Carbide Power MOSFET Module", Energy Conversion Congress and Exposition, Sep. 2010, p. 3303-p. 3310.

Song et al., "The new intelligent power modules with Reverse conducting IGBTs and SOI driver for low power motor drives", International Conference on Electrical Machines and Systems, Oct. 2010, p. 384-p. 386.

Ostmann et al., "Chip Embedding Technology for Power Applications", 5th International Microsystems Packaging Assembly and Circuits Technology Conference, Oct. 2010, p. 1.

Igarashi, et al., "Design of high reliability packaging for Fuji High Power Module", International Conference on Electrical Machines and Systems, Aug. 2011, p. 1-p. 6.

Guth et al., "New assembly and interconnect technologies for power modules", 7th International Conference on Integrated Power Electronics Systems, Mar. 2012, p. 1-p. 5.

"Office Action of Taiwan Counterpart Application", issued on Mar. 16, 2015, p. 1-p. 5.

* cited by examiner

STACKED TYPE POWER DEVICE MODULE

CROSS-REFERENCE TO RELATED APPLICATION

This application claims the priority benefit of Taiwan application serial no. 101146419, filed on Dec. 10, 2012. The entirety of the above-mentioned patent application is hereby incorporated by reference herein and made a part of this specification.

TECHNICAL FIELD

The disclosure relates to a semiconductor device module, and relates to a stacked type power device module.

BACKGROUND

Currently, the design of a commercialized power device module is that the device is arranged directly on the planar substrate having the heat dissipating effect and the electrical and signal connections of the device are achieved through wire bonding. Although such an arrangement may enhance heat dissipating efficiency, the area required by the module is also increased. Meanwhile, large amount of wire bonding may cause current crowding, which leads to the failure of the device module.

SUMMARY

An embodiment of the disclosure provides a stacked power device module, including at least one substrate having a first surface and a second surface, at least one first device, at least one second device, a circuit pattern, and at least one filler layer. The at least one first device is located on the first surface of the substrate and is electrically connected to the substrate; the at least one second device is located on the at least one first device and is electrically connected to the substrate; the at least one filler layer covers on the first surface of the substrate and encapsulates the at least one first device and the at least one second device, and the at least one filler layer includes a plurality of first conductive plugs and at least one second conductive plug. The circuit pattern is located on the at least one second device and is located on the at least one filler layer. The circuit pattern is connected to the at least one second device via the plurality of first conductive plugs. The circuit pattern is connected to the at least one first device via the at least one second conductive plug, wherein the height of the at least one second conductive plug is greater than the height of each of the at least one first conductive plug.

In order to make the aforementioned features of the disclosure more comprehensible, embodiments accompanying figures are described in detail below.

DESCRIPTION OF EMBODIMENTS

The disclosure relates to a three dimensional packaging process in which a plurality of chips and/or package structures may be joined together by way of vertically stacking, and therefore wire bonding joints can be reduced. Also, the overall volume and size of the package structure can be decreased, and an electrical connection path of the device may be shortened so that electrical property is improved. The design of the disclosed structure is compatible for additional heat dissipating module(s) to help the heat generated in the module to be dissipated.

FIGS. 1A-1H illustrate a cross-sectional schematic view of manufacturing processes of a stacked type power device module according to an embodiment of the disclosure.

Figure 1A:
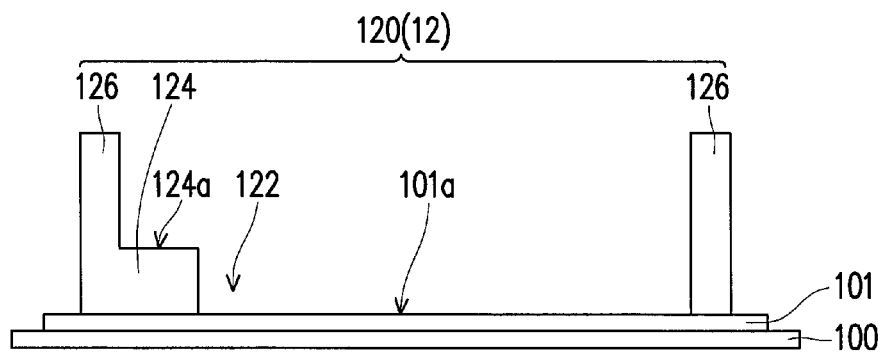
FIGS. 1A-1H illustrate a cross-sectional schematic view of manufacturing processes of a stacked type power device module according to an embodiment of the disclosure.

Referring to FIG. 1A, a substrate 100 is provided for carrying a metal substrate 12, and the substrate 100 may be unloaded or removed in the process. The metal substrate 12 is, for example, a lead frame 120 which is formed of a metal such as copper or aluminum alloy. The lead frame 120 includes at least one void region 122 and a plurality of half etching blocks 124 and a sidewall block 126. The void region 122 exposes an upper surface 101a of an adhesive layer 101. The adhesive layer 101 is disposed on the substrate 100. The metal substrate 12 is disposed on the adhesive layer 101. The half etching block 124 currently shown in the figure will become the electrically connection portion of the lead frame 120 (i.e. a bonding contact terminal) in the process. The sidewall block 126 of the lead frame may become an external electrical connection terminal in the subsequent process. The lead frame 120 may include more than one half etching block and/or more than one void region, even though only one is shown in the figure.

The relative disposing position between the void region and the lead frame or the number thereof described in the embodiment is not intended to limit the scope of this disclosure, and may be adjusted or changed depending on the type of the used chip and device or the package structure.

Figure 1B:
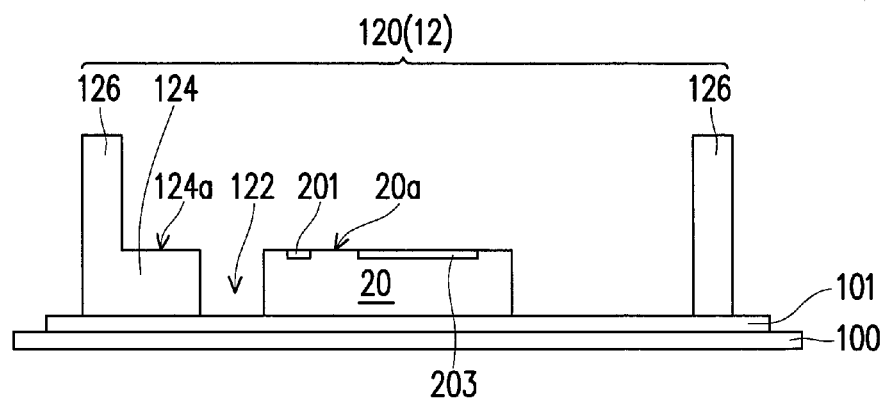

Referring to FIG. 1B, a first device 20 is disposed on the upper surface 101a of the adhesive layer 101 exposed by the void region 122 of the metal substrate 12. The first device 20 is, for example, a power device such as a metal-oxide-semiconductor field-effect transistor (MOSFET), an insulated gate bipolar transistor (IGBT), or diode, etc., or a packaged device. At least one device is disposed in each void region 122 of the metal substrate 12. The size of the void region 122 of the metal substrate 12 is at least larger than the size of the correspondingly carried device or die thereby. The pattern design of the void region 122 may be adjusted according to the device used therein or depending on the requirement of heat dissipating efficiency.

Figure 1C:
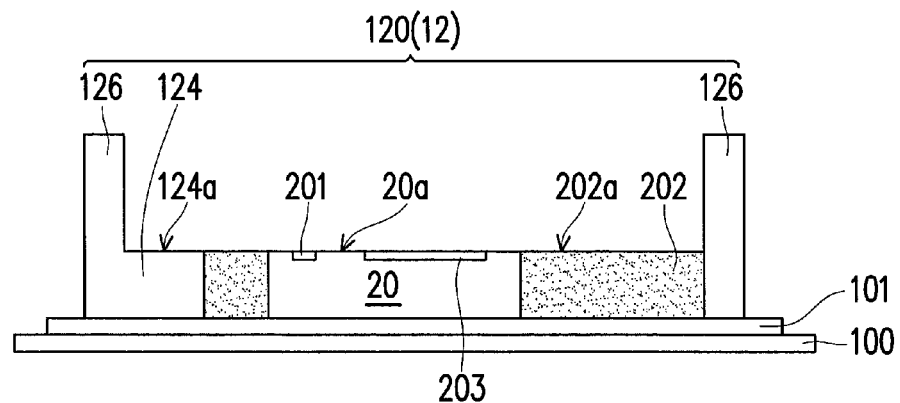

Referring to FIG. 1C, a first filler layer 202 is formed and disposed on the substrate 100, covering the exposed upper surface 101a of the adhesive layer 101 as well as encapsulating the first device 20 and filling up the voids between the first device 20 and the sidewall block 126 of the lead frame 120. A material of the first filler layer 202 is, for example, an ultraviolet curable polymer, a thermosetting polymer, epoxy resin, polyimide or benzocyclobutene (BCB), and may be formed by molding or lamination. During the molding process, generally a mold is used and at a specific position an encapsulation material is injected into the mold. After curing the encapsulation material by thermal treatment or ultraviolet light irradiation, the filler layer 202 is formed and the mold is removed. For the lamination, a dielectric material layer with a predetermined thickness is directly laminated onto the lead frame 120 and the substrate 100 to form the first filler layer 202. For example, in one embodiment, the thickness of the first filler layer 202 is roughly equivalent to the thickness of the first device 20, and the first filler layer 202 at least exposes a bonding pad 201 and a bonding pad 203 of the first device 20. By equivalent thickness it means that an upper surface 202a of the first filler layer 202 is coplanar with an upper surface 20a of the first device 20. For example, in one embodiment, the upper surface 202a of the first filler layer 202 is coplanar with an upper surface 124a of the half etching block 124. After curing and forming the filler layer 202, the substrate 100 may be removed with the mold or after removing the mold.

Figure 1D:
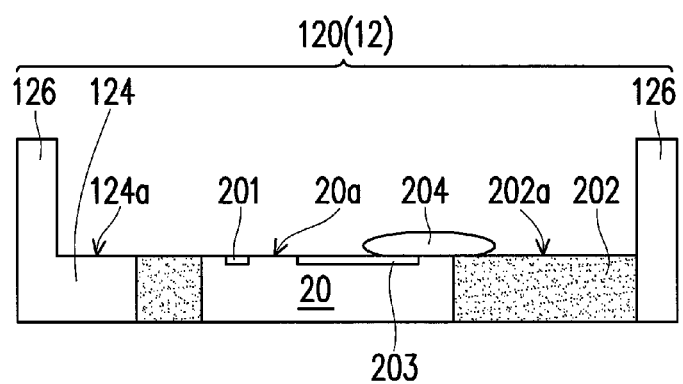

Referring to FIG. 1D, a conductive adhesive layer 204 is formed on the upper surface 202a of the first filler layer 202 and the upper surface 20a of the first device 20. A material of the conductive adhesive layer 204 is, for example, conductive adhesive, silver paste or solder paste, formed by coating, screen printing, or film lamination. The conductive adhesive layer 204 may be formed by plating metal layers at the to-be-contact positions of the first device 20 and a second device 30. An inter-diffusion may occur between both metal layers after treating with the thermomechanical process, and then an intermetallic compound (IMC) may be formed at the interface to achieve the connection.

Figure 1E:
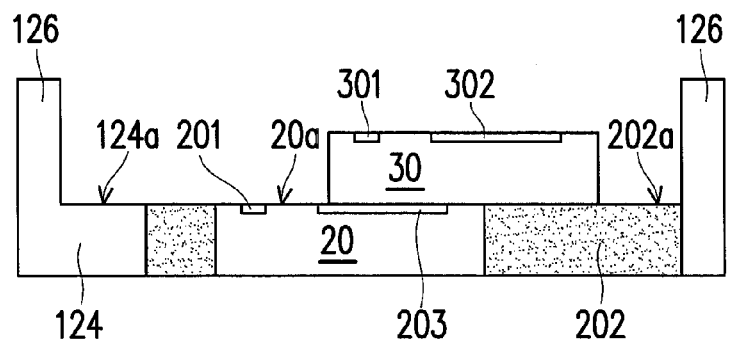

Referring to FIG. 1E, the second device 30 is disposed on the conductive adhesive layer 204, covering a portion of the upper surface 202a of the first filler layer 202 and a portion of the bonding pad 203 of the first device 20. The second device 30 may partially overlap with the first device 20 to expose the wire bonding pads 201 and 301 on the first and second devices 20 and 30. The electrical connection between the first and second devices 20 and 30 may be achieved via the conductive adhesive layer 204. The second device 30 is, for example, a power device such as MOSFET, IGBT, diode, or a packaged device.

Figure 1F:
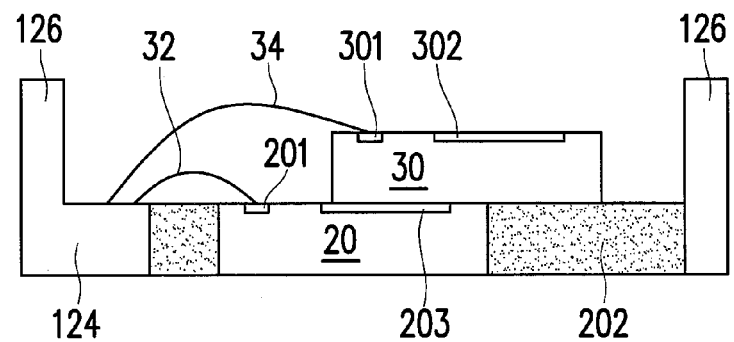

Referring to FIG. 1F, a plurality of wires 32 and 34 formed by wiring are respectively connected to the first and second devices 20 and 30 as well as to the corresponding half etching block 124 of the lead frame 120. A first end of the wire 32 is connected to the bonding pad 201 of the first device 20, and a second end of the wire 32 is connected to the half etching block 124. A first end of the wire 34 is connected to the bonding pad 301 of the second device 30, and a second end of the wire 34 is connected to the half etching block 124.

Figure 1G:
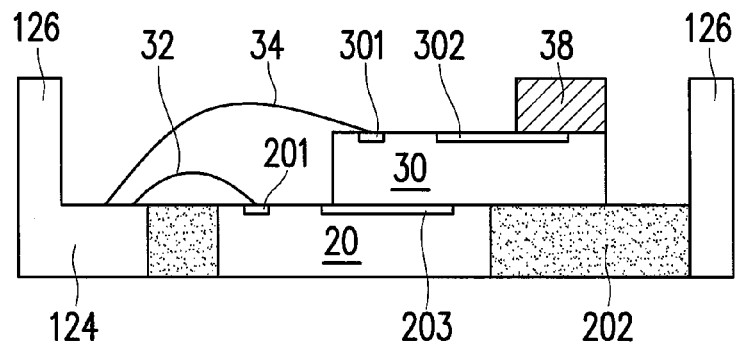

Referring to FIG. 1G, a conductive block 38 is placed on a contact pad 302 of the second device 30 at an end of the second device 30. The conductive block 38 may be fabricated by a metal material (such as copper) and connected in the same way for connecting the devices 20 and 30, which may function as an electrode in the subsequent process.

Figure 1H:
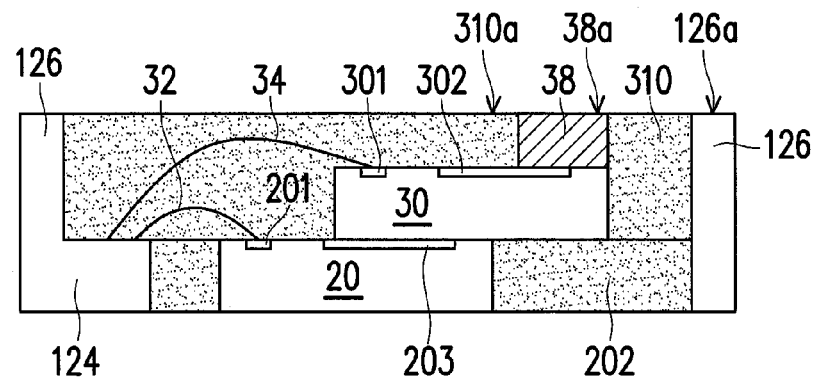

Referring to FIG. 1H, a second filler layer 310 is formed and disposed on the first filler layer 202, encapsulating the second device 30, wires 32 and 34, conductive block 38 and covering the first device 20 and the first filler layer 202. The second filler layer 310 fills up the space between the sidewall 126 of the lead frame 120 and the second device 30 as well as the conductive block 38. The thickness of the second filler layer 310 is roughly equivalent to or slightly less than the thickness of the conductive block 38, at least exposing a portion of an upper surface 38a of the conductive block 38 for electrical connection in the process. By equivalent thickness it means that an upper surface 310a of the second filler layer 310 is coplanar with an upper surface 38a of the conductive block 38. For example, in one embodiment, the upper surface 310a of the second filler layer 310 is coplanar with an upper surface 126a of the sidewall 126 of the lead frame 120. A material of the second filler layer 310 is, for example, an ultraviolet curable polymer, a thermosetting polymer, epoxy resin, polyimide, or benzocyclobutene (BCB), formed by molding or lamination, depending on the type of the device to be packaged. The first and second filler layers 202 and 310 may be formed of the same material or different materials. The material for forming the first and the second filler layers 202 and 310 may be a dielectric material with a high heat-dissipating efficiency or may further include one or a plurality of additives that enhance heat dissipation, such as boron nitride (BN) particles, silica ($SiO_2$) particles, alumina ($Al_2O_3$) particles, and etc.

FIGS. 2A-2H illustrate a cross-sectional schematic view of manufacturing processes of a stacked type device module according to another embodiment of the disclosure.

Figure 2A:
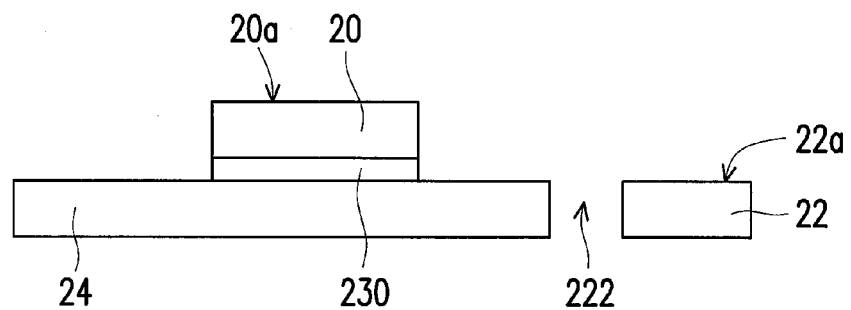
FIGS. 2A-2H illustrate a cross-sectional schematic view of manufacturing processes of a stacked type device module according to another embodiment of the disclosure.

Referring to FIG. 2A, a substrate 22 having an upper surface 22a is provided and a first device 20 is disposed on the upper surface 22a. The substrate 22 may be a metallic substrate formed of a metal such as copper or aluminum alloy. The substrate 22 may also be a printed circuit board or even a ceramic substrate with metallic circuit. The substrate 22 at least includes a void region 222. The void region 222 may be a hole, recess, or concave. The substrate 22 may include a plurality of patterns, of which some may be continuous or discrete, including at least a metallic block pattern 24 that is used for carrying the first device 20 and also for dissipating heat. An adhesive layer 230 may be selectively formed between the metallic block pattern 24 and the first device 20. The adhesive layer 230 may be formed of the same material as that of the conductive adhesive layer 204 in the previous embodiment, such as conductive adhesive, silver paste, or solder paste, formed by coating, screen printing, or film lamination. The conductive adhesive layer 204 may be formed by plating metal layers at the to-be-contact positions of the first device 20 and a second device 30. An inter-diffusion will occur between both metal layers after treating with the thermomechanical process, and then an intermetallic compound (IMC) is formed at the interface to achieve the connection. The first device 20 is, for example, a power device such as MOSFET, IGBT, diode, or etc. in the form of a chip or even a packaged device.

Figure 2B:
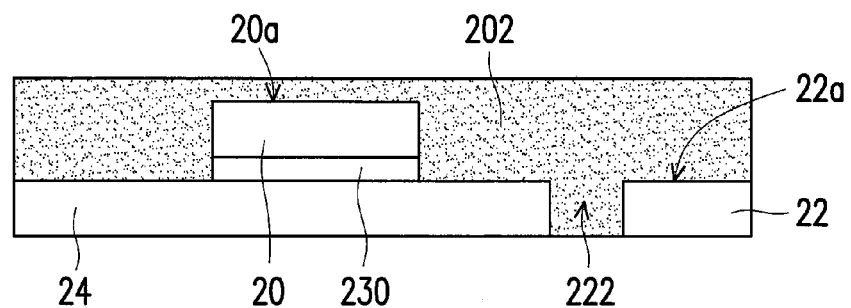

In FIG. 2B, the first filler layer 202 is formed and disposed on the substrate 22, encapsulating the exposed upper surface 22a and covering the first device 20. The first filler layer may be formed of, for example, an ultraviolet curable polymer, a thermosetting polymer, epoxy resin, polyimide, or benzocyclobutene (BCB), formed by molding or lamination. With regard to the lamination, a dielectric material layer with a predetermined thickness is directly laminated onto the upper surface 22a of the substrate 22 and fills up the void region 222 to form the filler layer 202. For example, in one embodiment, the thickness of the first filler layer 202 is greater than the thickness of the first device 20. That is, the upper surface 202a of the first filler layer 202 may be higher than the upper surface 20a of the first device 20.

Figure 2C:
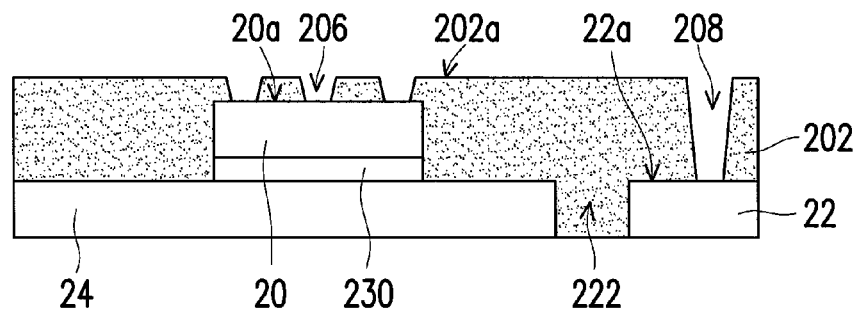

In FIG. 2C, an opening forming step is performed to the first filler layer 202. A first via 206 is formed by drilling from the upper surface 202a of the first filler layer 202 downward until the upper surface 20a of the first device 20 is exposed. A second via 208 is formed by drilling from the upper surface 202a of the first filler layer 202 downward until the upper surface 22a of the substrate 22 is exposed. The first and second vias 206 and 208 may be formed at the same time or in turn by using mechanical drilling or laser drilling.

For example, when the laser drilling technique is adopted for fabricating the via, parameters such as, laser output power, processing speed and the repetition times of processing may be adjusted, avoiding damages to the underlying material of the opening. The laser via may be intact devoid of forming a protection layer on the pad.

Figure 2D:
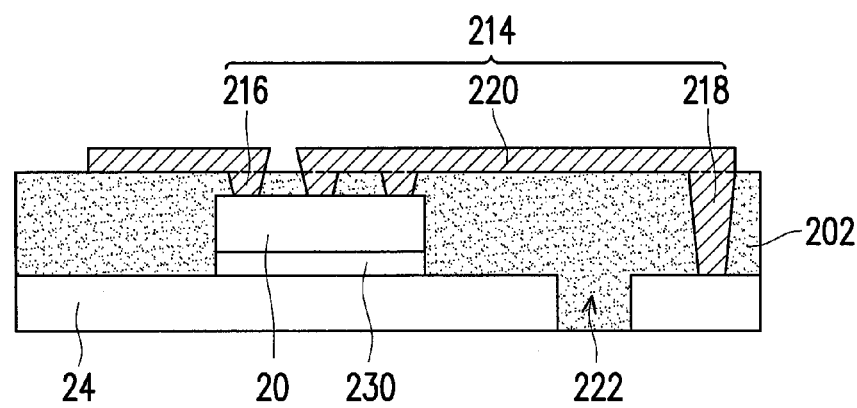

In FIG. 2D, a plating process is performed. A metallic conductive material 214 is plated to cover the upper surface 202a of the first filler layer 202 and filled in the first and second vias 206 and 208 to form first and second conductive plugs 216 and 218. A first circuit pattern 220 is formed on the upper surface 202a of the first filler layer 202 through a patterning step. The metallic conductive material 214 is, for example, copper. The first circuit pattern 220 may be a metal circuit pattern for re-distribution and therefore may also be regarded as a re-distribution pattern.

Figure 2E:
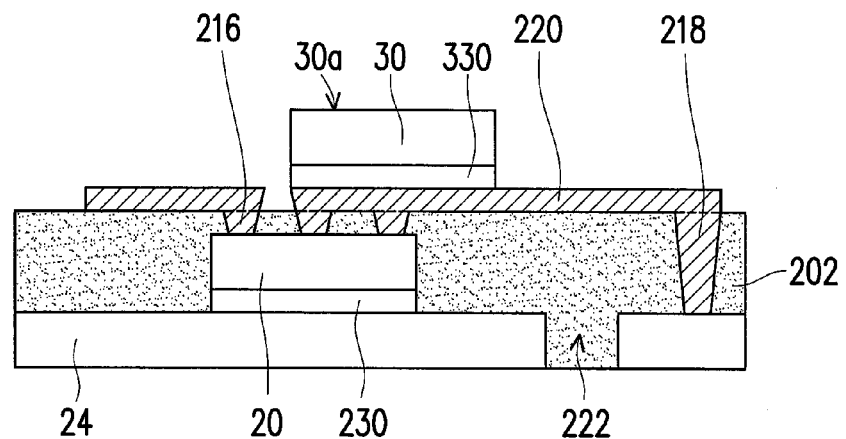

Referring to FIG. 2E, a second device 30 is disposed on a surface of the metallic conductive material 214. Optionally, an adhesive layer 330 may be formed between the metallic conductive material 214 and the second device 30 by conductive adhesive, silver paste, solder paste, and etc., formed by coating, screen printing, or film lamination. The conductive adhesive layer 204 may be formed by plating metal layers at the to-be-contact positions of the first device 20 and a second device 30. An inter-diffusion may occur between both metal layers after treating with the thermomechanical process, an intermetallic compound (IMC) is formed at the interface to achieve the connection. The second device 30 is, for example, a power device such as MOSFET, IGBT, diode, or etc., a chip, or even a packaged device. The first device 20 and the second device 30 may have different functions or may be formed of different materials.

Figure 2F:
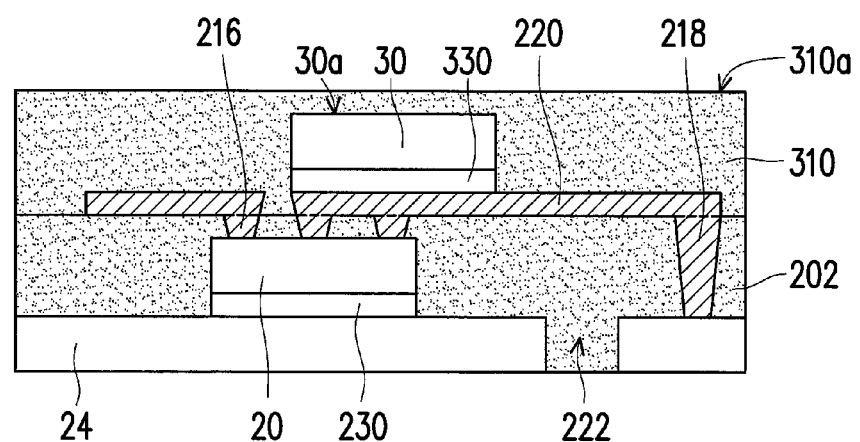

In FIG. 2F, a second filler layer 310 is formed and disposed on the substrate 22, covering the metallic conductive material 214 and the exposed upper surface 202a of the first filler layer 202 as well as encapsulating the second device 30. The second filler layer 310 is formed of, for example, an ultraviolet curable polymer, a thermosetting polymer, epoxy resin, polyimide, or benzocyclobutene (BCB), formed by molding or lamination. For example, in one embodiment, the height of the second filler layer 310 may be greater than the height of the second device 30. That is, an upper surface 310a of the second filler layer 310 may be higher than an upper surface 30a of the second device 30.

Figure 2G:
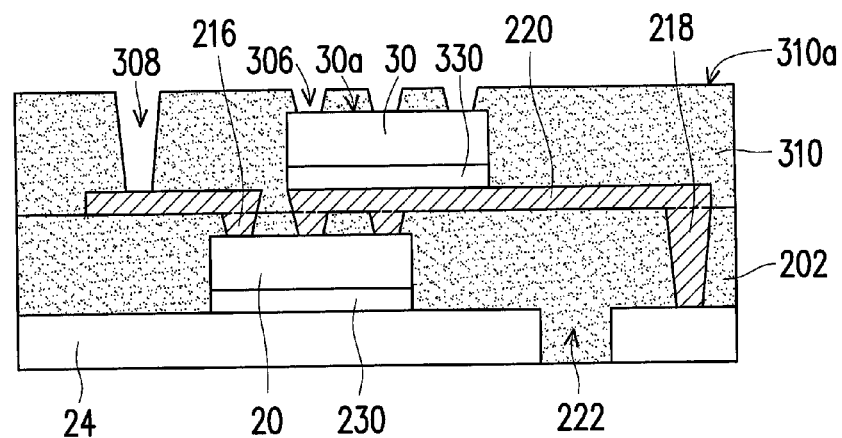

In FIG. 2G, another opening forming step is performed to the second filler layer 310. A third via 306 is formed by drilling from the upper surface 310a of the second filler layer 310 downward until the upper surface 30a of the second device 30 is exposed. A fourth via 308 is formed by drilling from the upper surface 310a of the second filler layer 310 until the metallic conductive material 214 is exposed. The third and fourth vias 306 and 308 may be formed at the same time or in turn by using mechanical drilling or laser drilling.

Figure 2H:
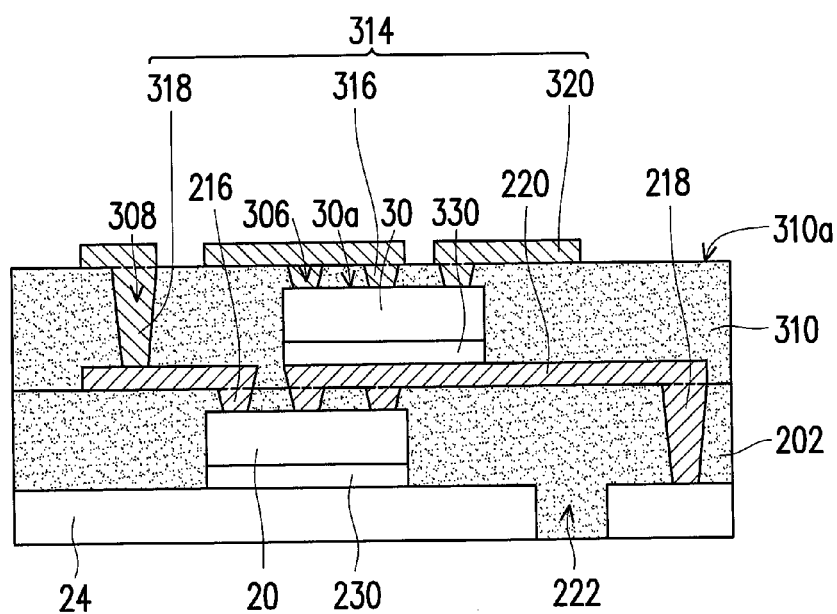

In FIG. 2H, a plating process is performed. Another metallic conductive material 314 is plated to cover the upper surface 310a of the second filler layer 310 and filled in the third and fourth vias 306 and 308 to form third and fourth conductive plugs 316 and 318. A second circuit pattern 320 is formed on the upper surface 310a of the second filler layer 310 through a patterning step. The second circuit pattern 320 may be a metal circuit pattern for re-distribution and therefore may also be regarded as a re-distribution pattern.

The relative disposing position between the via/conductive plug(s) and the device or the number thereof as described in the embodiments of the disclosure is exemplary and is not intended to limit the scope of the disclosure. The relative disposing position or the number thereof may be adjusted or changed depending on the type of device used or the design of the actual products. The pattern design of the re-distribution metal pattern may be changed depending on the electrical connection terminal or electrical requirement of the vertically stacked device. The conductive plug described in the embodiments of the disclosure may be a build-up conductive via depending on the size of the via and the filling level of the conductive material, may be formed by plating.

Figure 3:
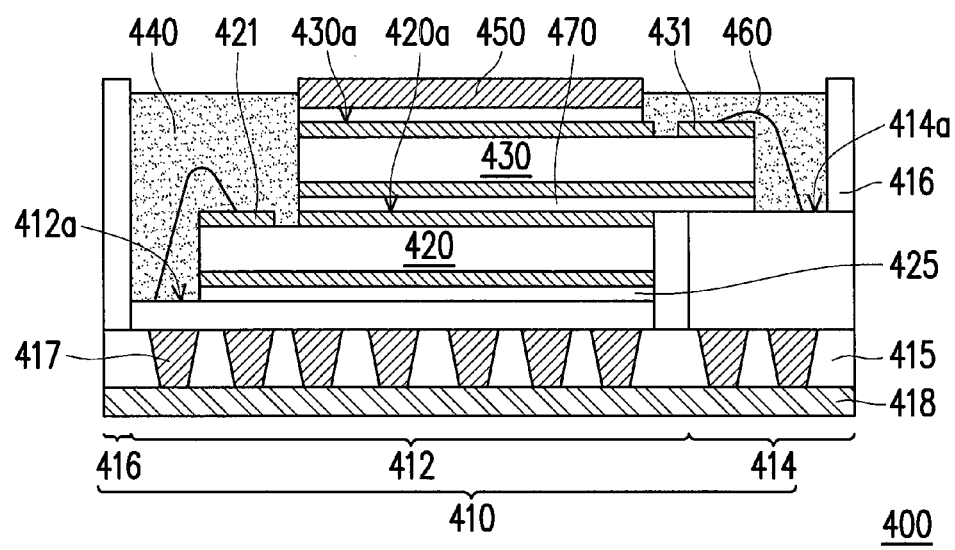
FIG. 3 is a schematic cross-sectional view of a stacked type device module in an embodiment of the disclosure.

FIG. 3 is a schematic cross-sectional view of a stacked type device module in an embodiment of the disclosure. Referring to FIG. 3, a semiconductor package module 400 includes a substrate 410, at least one first device 420, at least one second device 430, at least one filler layer 440, at least one electrode 450, and a plurality of wires 460, 461.

A substrate 410 is designed to have at least one sinking region 412, at least one platform region 414, and a sidewall block 416 located at the side for external connection. The substrate 410 may be, for example, a multi-layer printed circuit board or a laminated circuit board, which is fabricated via laminating metal boards with dielectric layers, and the substrate 410 may further include an internal circuit and a metallic conductive plug or a through via.

Referring to FIG. 3, a first device 420 is disposed on an upper surface 412a of the sinking region 412 of the substrate 410. A second device 430 is disposed on an upper surface 420a of the first device 420 and covers a portion of an upper surface 414a of the platform region 414. The electrode 450 is disposed on an upper surface 430a of the second device 430. The filler layer 440 covers over the substrate 410 and fills up the space between the device and the sidewall block 416 and also encapsulates the wires 460, 461. Although the electrode 450 is located on the upper surface 430a of the second device 430, at least one portion of an upper surface of the electrode 450 is exposed from the filler layer 440 for external connection. In one embodiment, all of an upper surface of the electrode 450 is exposed from the filler layer 440 for external connection. The electrode 450 may also be a part of the metal pattern or the circuit pattern and the shape of the electrode 450 varies depending on the design of the products.

Referring to FIG. 3, the second device 430 partially, instead of completely, overlaps with the first device 420 to expose the wire bonding pads 421 and 431 on the first and second devices. The depth of the sinking region 412 is roughly equivalent to the thickness of the first device 420 so that the second device 430 stacked on the first device 420 may partially rest on the platform region 414 without inclination. A plurality of wires 460, 461 respectively connect the first and second devices 420 and 430 to the corresponding sinking region 412 and the platform region 414 of the substrate 410. A first end of the wire 460 is connected to the wire bonding pad 421 of the first device 420, and a second end of the wire 460 is connected to the sinking region 412. A first end of the wire 461 is connected to the wire bonding pad 431 of the second device 430, and a second end of the wire 461 is connected to a half etching block of the platform region 414.

In the embodiment, the functions of the sinking region 412, the platform region 414 and the block 416 of the substrate 410 in FIG. 3 approximately are similar to that the functions of the void region 122, the half etching block 124, and the sidewall block 126 of the lead frame 120 in FIG. 1A.

The electrical connection between the first device 420 and second device 430 and between first device 420 and sinking region 412 may be achieved via the conductive adhesive layers 470 and 425. The conductive adhesive layers 425 and 470 are formed of, for example, silver paste or other appropriate adhesives. The first and second devices 420 and 430 may independently and respectively be a power device such as MOSFET, IGBT, diode, or a packaged device. The first device 420 and second device 430 may have different functions or may be formed of different materials. The wire 460/461 is, for example, a gold wire, copper wire, or aluminum wire. The electrical connection between the first and second devices 420 and 430 may be achieved via solid liquid inter-diffusion (SLID) technique, for example. The SLID technique is to form metal layers respectively on the contact surfaces of both devices and perform the thermomechanical treatment to cause inter-diffusion between the contact surfaces. The metal layer(s) may include elements such as copper, nickel, tin, silver, gold, titanium, and etc.

The filler layer 440 is formed of, for example, an ultraviolet curable polymer, a thermosetting polymer, epoxy resin, ajinomoto built-up film (ABF film), polyimide, or benzocyclobutene (BCB), by molding or lamination, depending on the type of the device to be packaged. The material of the filler layer may be a dielectric material with high heat-dissipating efficiency or may further include additives that enhance heat dissipation.

The substrate 410 shown in FIG. 3 further includes an external contact surface 418 located at the bottom layer of the substrate 410. A filler material 415 and one or more through vias 417 are disposed between the external contact surface 418 and the sinking region 412 for electrical connection and heat dissipation. The first and second devices 420 and 430 are, for example, power devices. The electrode 450 as an emitter and the sidewall block 416 as a gate may be located at the same side, while the external contact surface 418 as a collector may be located at the opposite side.

Figure 4A:
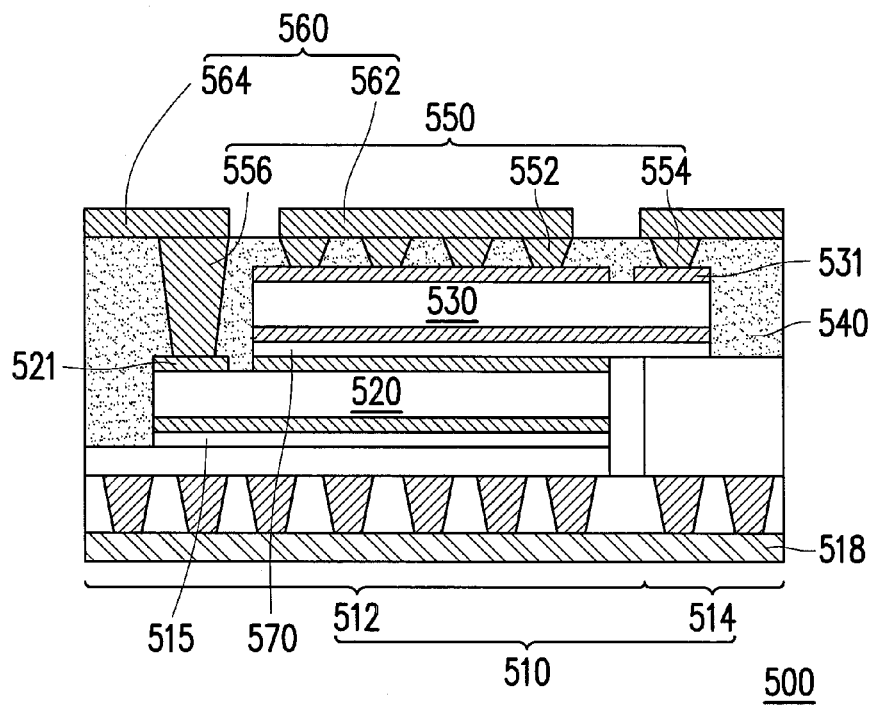
FIG. 4A is a schematic cross-sectional view of a stacked type device module in another embodiment of the disclosure.
Figure 4B:
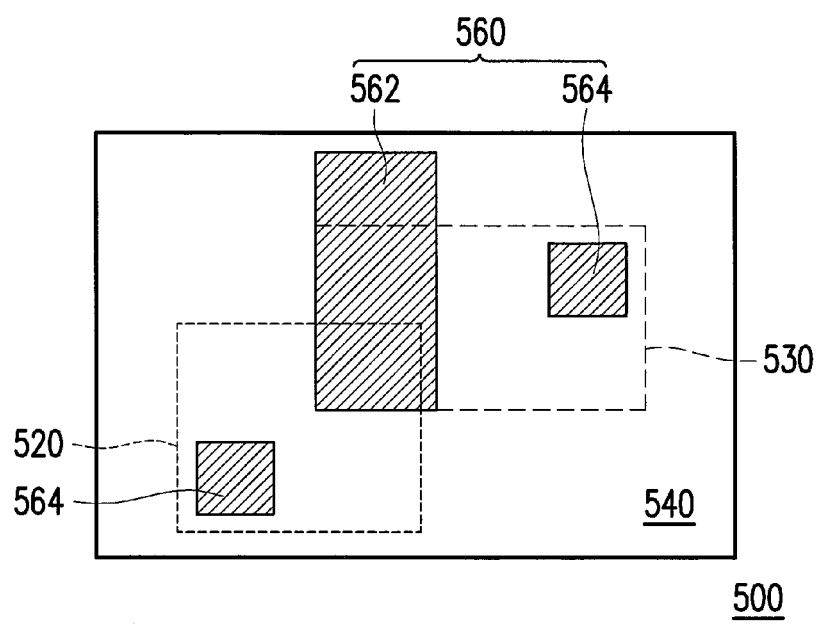
FIG. 4B is a schematic top view of an exemplary stacked type device module of the disclosure.

FIG. 4A is a schematic cross-sectional view of a stacked type device module in another embodiment of the disclosure. FIG. 4B is a schematic top view of an exemplary stacked type device module of the disclosure.

Referring to FIG. 4A, according to another embodiment of the disclosure, the difference between a semiconductor package module 500 and the semiconductor package module 400 as shown FIG. 3 lies in that all the circuits are connected by plating through vias without involving any wiring process. The semiconductor package module 500 includes a substrate 510, at least one first device 520, at least one second device 530, at least one filler layer 540, a plurality of conductive plugs 550, and at least one circuit pattern 560.

Referring to FIG. 4A, the substrate 510 and the substrate 410 as shown FIG. 3 are similarly designed, having at least one sinking region 512 and at least one platform region 514. The substrate 510 is, for example, a multi-layer printed circuit board or a laminated circuit board which may be fabricated via laminating metal boards with dielectric layers, and may further include an internal circuit and metallic conductive plugs or through vias. The design of the sidewall may be omitted from the substrate 510 as the connection can be achieved via the conductive plugs.

Referring to FIG. 4A, a first device 520 is disposed on the sinking region 512 of the substrate 510, and a second device 530 is disposed on the first device 520, covering a portion of an upper surface 514a of the platform region 514. The filler layer 540 covers over the substrate 510 and encapsulates the first and second devices 520 and 530. The first device 520 and the substrate 510 as well as the 520/530 may be connected by using the conductive adhesive layers 515 and 570. The conductive adhesive layers 515 and 570 may be formed of, for example, solder paste or silver paste. Alternatively, the connection technique such as a solid liquid inter-diffusion (SLID) technique may also be used to achieve the electrical connection there-between.

Referring to FIG. 4B, the second device 530 partially, instead of completely, overlaps with the first device 520 to expose contact pads 521 and 531 on the first and second devices 520 and 530. The depth of the sinking region 512 may be equivalent to the thickness of the first device 520 so that the second device 530 disposed on the first device 520 may partially rest on the platform region 514 without inclination.

The circuit pattern 560 includes a central circuit pattern 562 as an emitter terminal and a gate contact terminal 564 in the periphery of the circuit pattern. The central circuit pattern 562 may be connected to the second device 530 via a plurality of conductive plugs 552. The contact pads 521 and 531 on the first and second devices are electrically connected to the gate contact terminal 564 via the conductive plugs 556 and 554. Since the first and second devices 520 and 530 may be vertically stacked, the length (depth) of the conductive plug 556 may be greater than that of the conductive plugs 554 and 552. In one embodiment, through the conductive plugs 550 and the circuit pattern 560, the electrodes of the first and second devices 520 and 530 are connected to the corresponding external connection terminals. The substrate 510 shown in FIG. 4A further includes an external contact surface 518 located at the bottom-most layer of the substrate 510. Take a power device as an example, the circuit pattern 562 as an emitter and the gate contact terminal 564 as a gate are at the same side, while the external contact surface 518 as a collector is located at the opposite side.

Depending on the products, the outer-most portion of the circuit pattern may be used as a heat-dissipating structure through pattern design to enhance heat-dissipating efficiency.

The electrical connection between the first and second devices 520 and 530 may be achieved via the conductive adhesive layer 570. The conductive adhesive layer 570 is formed of, for example, solder paste or silver paste. Connection techniques such as SLID technique may be used to complete electrical connection between the two devices. The first and second devices 520 and 530 may independently and respectively be a power device such as MOSFET, IGBT, or diode etc., or a chip, or a packaged device. The first device 520 and the second device 530 may have different functions or may be formed of different materials. The first device 520 and the second device 530 may be a semiconductor chip such as a transistor, a radio-frequency (RF) chip, or a light emitting diode (LED). The conductive plug 550 is formed of, for example, copper or copper alloys.

In the embodiments of the disclosure, in order to integrate one or more devices, a lead frame with at least a void region and a half etching block as well as a substrate with a sinking region and a platform region are provided for embedding devices, to reduce the overall size or volume of the package and promote electrical transmission.

In the embodiments of the disclosure, the connection between the device and substrate as well as the connection between the devices may be achieved by using conductive materials (such as solder paste, silver paste, and etc.) or other connection techniques (such as SLID technique and etc.).

In the embodiments of the disclosure, redistribution and fanning out the electrode contacts may be achieved by laminating dielectric layers and metal patterns (build-up layers). By using the laser drilling technique to fabricate a via, intact via openings are obtained and there is no need to fabricate a protection layer over the contact pad. Also, a plating process may be used to fill the via opened to form the conductive plug (such as copper or its alloy) therein. Upon the completion of the electrical connection, an intermetallic compound (IMC) may be formed between the conductive plug and the joint point following the subsequent thermal treatment process, which enhances long term reliability.

When the module is operated under a heavy current mode, a heat-dissipating structure or module may be required. The design of the disclosure may incorporate the heat-dissipating module. Since the dielectric layer or the filler material encapsulates and protects the device(s), the module of the disclosure may have better heat-conducting efficiency than the module using wire bonding.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A stacked type power device module, at least comprising:
   a substrate, having a first surface and a second surface opposite to the first surface;
   at least one first device, located on the first surface of the substrate and electrically connected to the substrate;
   at least one second device, located on the at least one first device and electrically connected to the substrate, wherein a portion of the at least one second device overlaps with a portion of the at least one first device;
   a conductive adhesive layer disposed between the at least one first device and the at least second one device and in direct contact with the overlapped portions of the first and second devices, wherein the at least one first device and the at least one second device are physically and electrically connected via the conductive adhesive layer;
   at least one filler layer, covering the first surface of the substrate and encapsulating the at least one first device and the at least one second device, wherein the at least one filler layer comprises a plurality of first plugs and at least one second plug; and
   a circuit pattern, located above the at least one second device and located on the at least one filler layer, wherein the circuit pattern connects to the at least one second device via the plurality of first plugs, and the circuit pattern connects to the at least one first device via the at least one second plug, wherein a height of the at least one second plug is greater than a height of each of the plurality of first plugs.

2. The stacked type power device module according to claim 1, further comprising at least one electrode located on the at least one second device, and a surface of the at least one electrode is exposed from the at least one filler layer.

3. The stacked type power device module according to claim 2, wherein the at least one first device and the at least one second device are electrically connected to the substrate via a plurality of wires respectively.

4. The stacked type power device module according to claim 1, wherein the substrate further comprises at least one sinking region and a platform region, the at least one first device is disposed in the at least one sinking region, wherein a depth of the at least one sinking region is equivalent to a thickness of the at least one first device, and the at least one second device is disposed in the platform region and on the at least one first device.

5. The stacked type power device module according to claim 4, wherein a material of the conductive adhesive layer comprises a conductive adhesive, silver paste, or solder paste.

6. The stacked type power device module according to claim 4, wherein a material of the conductive adhesive layer comprises a stable compound formed by diffusion after plating metal layers.

7. The stacked type power device module according to claim 1, further comprising a redistribution pattern disposed between the at least one first device and the at least one second device.

8. The stacked type power device module according to claim 1, wherein the substrate is a metal lead frame.

9. The stacked type power device module according to claim 1, wherein the substrate is a laminated circuit board and the second surface of the substrate further comprises an external contact surface.

10. The stacked type power device module according to claim 1, wherein the at least one first device or the at least one second device is a power device, a chip, or a package body that is partially packaged.

11. The stacked type power device module according to claim 1, wherein a material of the filler layer comprises an ultraviolet curable polymer, a thermosetting polymer, epoxy resin, polyimide, or benzocyclobutene (BCB).

* * * * *